United States Patent
Takase et al.

[11] Patent Number: 6,028,011
[45] Date of Patent: Feb. 22, 2000

[54] METHOD OF FORMING ELECTRIC PAD OF SEMICONDUCTOR DEVICE AND METHOD OF FORMING SOLDER BUMP

[75] Inventors: Yoshihisa Takase; Naoki Okazaki, both of Osaka, Japan

[73] Assignee: Matsushita Electric Industrial Co., Ltd., Osaka, Japan

[21] Appl. No.: 09/170,633

[22] Filed: Oct. 13, 1998

[30] Foreign Application Priority Data

Oct. 13, 1997 [JP] Japan .................................. 9-278370
May 29, 1998 [JP] Japan ................................. 10-148968

[51] Int. Cl.$^7$ .................................................. H01L 21/00
[52] U.S. Cl. ......................... 438/745; 438/613; 438/754
[58] Field of Search ................................. 438/613, 614, 438/617, 745, 754; 216/14, 34, 100, 102

[56] References Cited

U.S. PATENT DOCUMENTS 5,462,638 10/1995 Datla et al. ......................... 438/754 X
5,773,359 6/1998 Mitchell et al. ..................... 438/754 X

FOREIGN PATENT DOCUMENTS 63-305532 12/1988 Japan .
1-81344 3/1989 Japan .
2-90529 3/1990 Japan .
9-69524 3/1997 Japan .

*Primary Examiner*—William Powell
*Attorney, Agent, or Firm*—Ratner & Prestia

[57] ABSTRACT

Electroless nickel plating and gold plating is performed on an aluminum electrode in order to construct a highly reliable electrode. The steps are: depositing zinc on the aluminum electrode with zincate treatment liquid containing sodium hydroxide and zinc oxide; immersing it in solution which is prepared by dissolving sodium hypophosphite as a reducing agent into de-ionized water, followed by addition of de-ionized water while adjusting for the pH of 9.0 to 12.0 with sodium hydroxide solution, so as to make a total volume of 1000 ml; nickel-plating the aluminum electrode of the semiconductor device by using electroless nickel plating solution of oxidation-reduction reacting type containing sulfur compound as a reaction promoter, under a condition of the pH at 4.0 to 6.8 and a temperature of 80 to 90° C.; electroless gold-plating by substitutional reaction type; and, electroless gold-plating by oxidation-reduction reacting type, so as to form a nickel film containing phosphor and gold plated films on all aluminum electrodes of the semiconductor device. In this way, a nickel plate film of good electrical conductivity and also a gold plate of a thick film on all aluminum electrodes of the semiconductor device are formed, without resulting in corrosion of the passivation film and the aluminum electrodes.

16 Claims, 8 Drawing Sheets

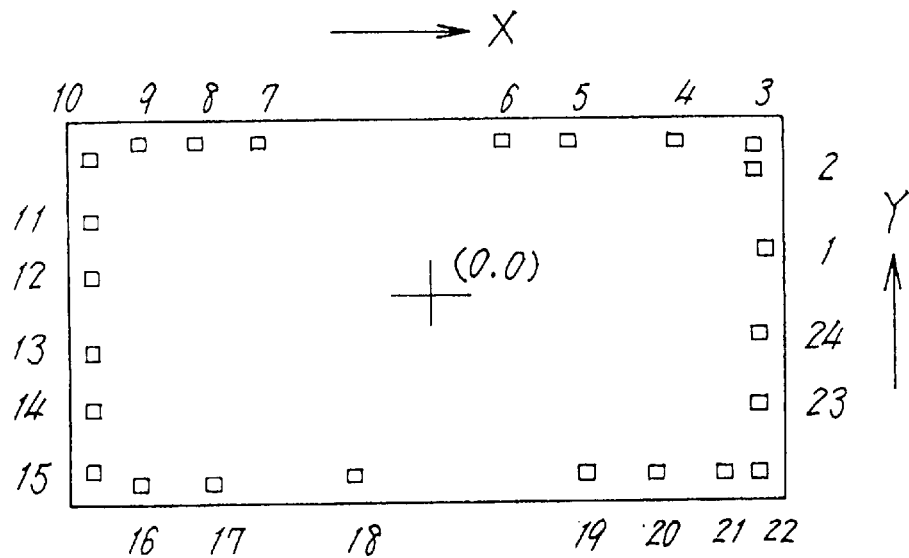
FIG. 6
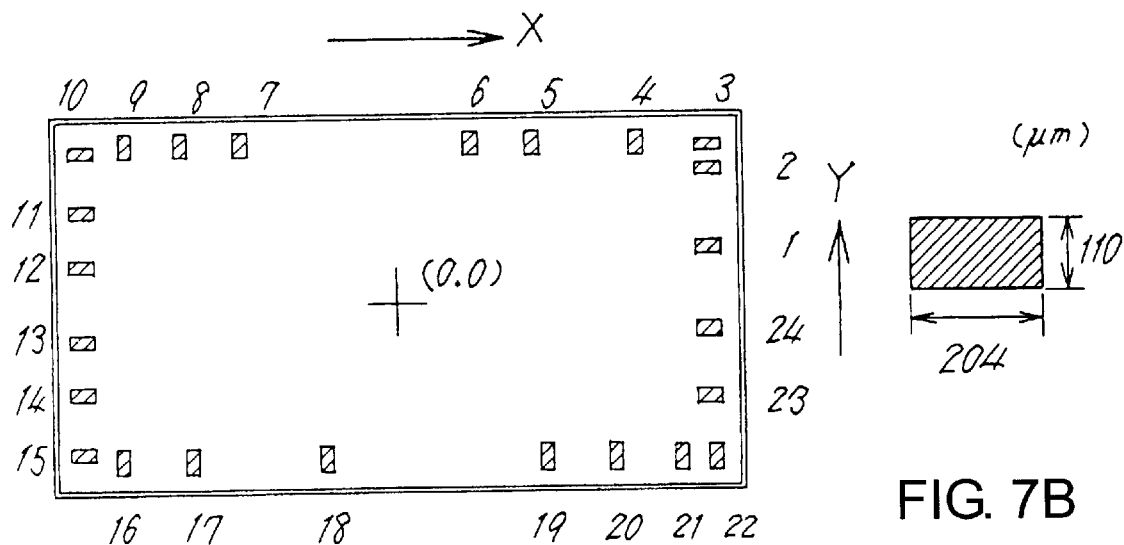
FIG. 7A
FIG. 7B

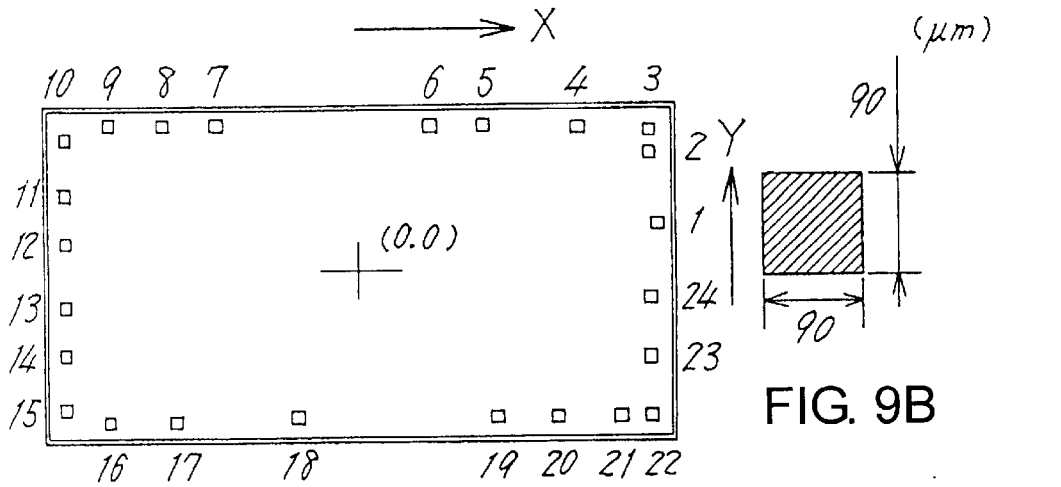
FIG. 9A
FIG. 9B
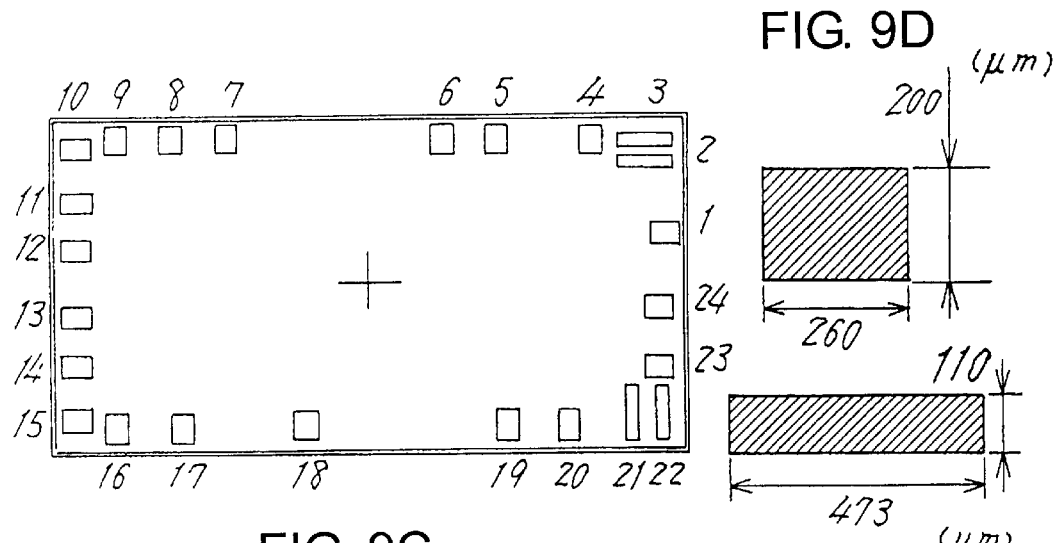
FIG. 9C
FIG. 9D
FIG. 9E
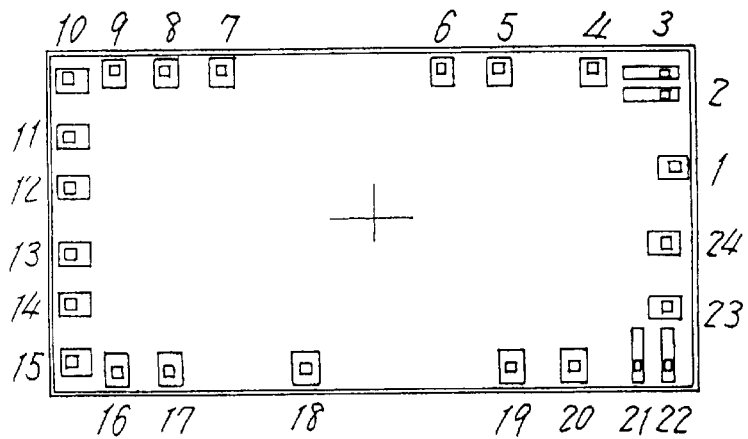
FIG. 9F

METHOD OF FORMING ELECTRIC PAD OF SEMICONDUCTOR DEVICE AND METHOD OF FORMING SOLDER BUMP

FIELD OF THE INVENTION

The present invention relates to a method of forming an electrode of a semiconductor device and a method of forming a solder bump, which are used when mounting the semiconductor device by using a wireless bonding method such as a flip chip method, a film carrier method, etc.

BACKGROUND OF THE INVENTION

In recent years, a high density and a high integration of semiconductor devices such as an IC, LSI, etc. are being advanced in keeping with a trend of reducing size of electronic equipments. Also, there is a tendency of narrowing spaces between electrodes and an increase in number of input and output electrodes, in a viewpoint of mounting the semiconductor devices. Furthermore, there is a demand for a reduction of thickness, as can be seen on electronic calculators, notebook type personal computers and portable telephones.

A wireless bonding method such as a flip chip method, a tape automated bonding (TAB) method, etc. are suitable for these requirements with respect to reliability concerning gang bonding and accuracy of positional alignment, reduction in thickness, high density mounting, etc. of semiconductor devices. Thus, numerous studies and developments are being made with the anticipation that it will be a great mainstay in the mounting technique of the semiconductor devices in the future.

In the wireless bonding method, a metallic protrusion called a salient electrode or a bump is usually formed on an aluminum electrode of a semiconductor device.

As means of forming the salient electrode on an aluminum electrode of a semiconductor device, many methods have been suggested, and some of them have been put to practical use. Among them, a way of forming bumps with an electroless plating method is being studied in anticipation of the low cost. One example is a palladium nucleation method which has been disclosed by Japanese Patent Laid-open Publication No. S63-305532, Japanese Patent Laid-open Publication No. S64-81344 and Japanese Patent Laid-open Publication No. H09-69524.

This method is described by referring to FIG. 10A through FIG. 10C. A surface of an aluminum electrode 3 of a semiconductor device 2 composed of a silicon substrate 1 is cleaned after being pretreated by diluted solution of nitric acid (or phosphoric acid), as shown in FIG. 10A. A numeral 4 represents a passivation film. Successively, an exposed surface of the aluminum electrode 3 is adhered with deposit 5 of palladium, as shown in FIG. 10B, by immersing the semiconductor device 2 for 30 to 60 seconds in palladium active agent consisting of 1 gram of palladium chloride, 100 c.c. of hydrochloric acid and 9.54 liters of water.

Then, as shown in FIG. 10C, the semiconductor device 2 is cleaned without removing the palladium 5 deposited on the surface of the aluminum electrode 3 of the semiconductor device. The semiconductor device 2 is then applied with electroless plating for approximately one hour by immersing it in electroless nickel plating solution having a pH of 4 to 6 and a temperature of 80 to 90° C., so as to form a nickel bump 6 in a thickness of 20 $\mu$m around it, including an exposed surface of the aluminum electrode 3. After that, the semiconductor device 2 is applied with an electroless gold plating, after it is rinsed, by immersing it in electroless gold plating solution in order to form a golden layer 7 of 1 $\mu$m on a surface of the nickel bump 6.

However, since a catalytic treatment by the palladium active agent in the above example of the prior art has a difficulty in getting a selective plating reaction, as it deposits palladium on a surface of the semiconductor device and on a nonconductive part such as a passivation film 4 other than aluminum as being a metal, resulting in a possibility of initiating a plating reaction with the deposited palladium as a nucleus when nickel plating is being made, there are harmful effects such as deterioration of electrical insulation over the surface of a nonconductive body, an incident of short-circuiting due to a plating film bridging between the electrodes if a space between the electrodes is narrow, etc. Also, in case of an electroless nickel plating method by zincate treatment, which is usually used as a means for plating aluminum metal sheet for purposes other than semiconductors, it is not sufficient for use as an electrode for connection between the semiconductor device and the circuit substrate when the nickel plating is applied on the surface of aluminum utilized as an electrode of the semiconductor device, because roughness over a surface of the plated film is very large and an adhesion strength is weak if the aluminum used for the aluminum electrode is an alloy of, for instance, Al with 1% Si, etc. Besides, it was observed on a semiconductor device applied with the electroless nickel plating that there are some electrodes (specific electrodes: GND, Vcc, etc. for example) on which no metal of any kind has adhered. The same tendency was seen on electrodes of many kinds of semiconductor devices, and it was a phenomenon that the plating does not adhere to electrodes of the same location.

On the other hand, there are instances where a requirement for an accuracy of height of salient electrodes is quite strict, depending on a method of mounting in case of a flip chip mounting or a TAB mounting, so that a method referred to as leveling is adopted in which the salient electrodes are compressed by putting a pressure upon them in order to make all of uniform height. Because of a problem with these kind of salient electrodes of nickel, however, that they are not compressed due to the hardness of nickel, a film of gold plating having a lower hardness is desired.

A study has been made for gold plating solution of an oxidation-reduction reacting type in order to solve the above problem. However, in the study, it was not possible to form gold into the salient electrodes with the electroless plating method, since electroless gold plating solution of the prior art, which uses potassium boron hydride or dimethyl-amine borane (DMAB), etc. as a reducing agent and gold cyanide, e.g., potassium dicyanoaurate (I), etc. as a metal base, is of high alkalinity (pH of 13 to 13.6) and the solution temperature is comparatively high as 60 to 80° C., that it attacks a passivation film of the semiconductor, and there is not available a resist material of gold plating-proof. This gold plating solution also has a problem for working environments and for waste fluid disposal, because it contains cyanide.

SUMMARY OF THE INVENTION

A method of forming an electrode of semiconductor device of the present invention, in order to nickel-plate a surface of an aluminum electrode of the semiconductor device as a barrier metal or a salient electrode, is to apply a desmut treatment with smut removing liquid after subjecting the semiconductor device to an etching process with acid liquid or alkaline liquid, produce deposit of fine particles of Zn—Fe system alloy on the surface of the aluminum electrode by applying 1 to 3 times a zincate process for substituting aluminum with zinc at the same time with removal of an oxidized layer of aluminum from the surface of the aluminum electrode by alkaline solution of metallic acid base containing Fe as a metallic additive, activate the surface of the aluminum electrode by immersing it in alkaline solution dissolved with a reducing agent, and, while still wetted with solution of the reducing agent, apply nickel-plating by immersing the aluminum electrode in electroless nickel plating solution of oxidation-reduction reacting type taken into account a reaction promoter, and apply a flash gold plate over the nickel with an electroless gold plating method of substitutional reaction type.

The method further includes an application of gold plate of a larger layer thickness by immersing it in electroless gold plating solution of oxidation-reduction reacting type of neutral noncyanide system, depending on the mounting method.

Accordingly, the present invention is able to form a nickel plate layer of good electrical conductivity and even a gold plate layer of a large thickness on all of aluminum electrodes of the semiconductor device, without resulting in corrosion of the passivation film and the aluminum electrodes with a very simple facility and a simple method

BRIEF DESCRIPTION OF THE DRAWINGS

FIG. 6 is an arrangement plan of pads for the semiconductor device in the second exemplary embodiment of the present invention;

FIG. 7 is a plan view showing a shape of an opening of a mask used in the second exemplary embodiment of the present invention;

FIG. 9A through FIG. 9F are plan views showing shape of openings of masks used in the third exemplary embodiment of the present invention.

DESCRIPTION OF THE PREFERRED EMBODIMENTS

Figure 1A:
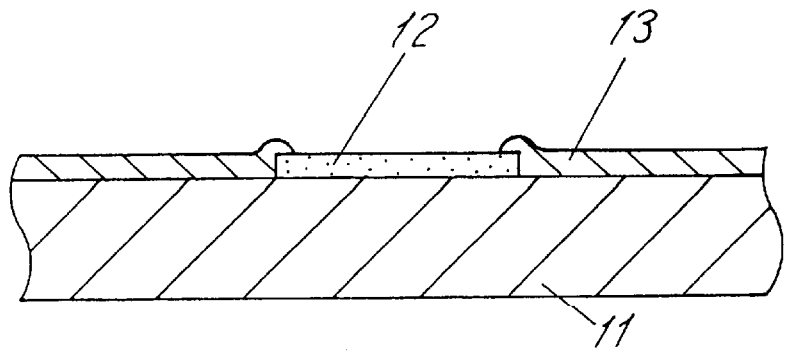
FIG. 1A through FIG. 1D are fragmentary cross sectional views of a semiconductor device showing individual treatment processes of plating on an aluminum electrode in a first exemplary embodiment of the present invention.

Even if an oxidized layer on a surface is removed by etching it with acid or alkaline, aluminum, in general, tends to produce a new oxidized layer again during water cleaning treatment and succeeding plating process to be carried out thereafter, so as to make it difficult for the plating film to adhere. Moreover, there is a potential difference between electrodes, since each terminal such as Vcc, GND, I/O, etc. as the electrodes of a semiconductor device are connected with functional devices such as a transistor, a resister, a capacitor, a PN junction, etc., and Vcc or GND is short circuited to a silicon substrate, i.e. a base of a semiconductor device, in certain cases, as a characteristic of the semiconductor device. For this reason, an ordinary plating method produces a local cell between the electrodes, which causes a phenomenon in that the plating is not executable depending on a condition of the local cell produced. When an accelerating force of reaction of an electroless nickel plating is considered, a reducing potential of $Ni^{2+}$ fluctuates substantially at a side of alkalinity in order to stabilize a Ni complex ion, although it is stable up to a proximity of pH 4 at a side of acidity. On the other hand, an oxidation-reduction potential of the reducing agent varies linearly throughout the pH range. Therefore, it is known that a value of the accelerating force of plating reaction, i.e. a reducing reaction also varies with the pH.

In the electroless nickel plating, for instance, at pH4,

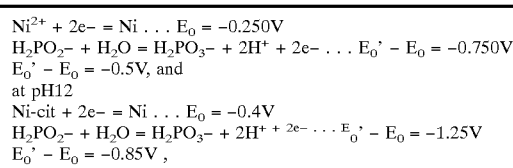

which indicates that the higher the pH is, the greater the accelerating force becomes.

Accordingly, it is important to produce a reducing power that exceeds the potential difference between each electrode of the semiconductor device with an efficient use of the accelerating force of reaction. In other words, it is important to maintain pH of the surface of the aluminum electrode at a high level (alkalinity side) and to keep amount of sodium hypophosphite or the reducing agent in rich condition, in order to maintain the surface of each aluminum electrode in rich condition with

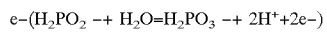

and to promote reaction of $Ni^{2+}+2e-=Ni$.

The present invention is able to attain a large reducing power and to form a nickel film around zinc particles previously deposited on the aluminum electrodes, without producing an oxidized layer on the surface of the aluminum electrodes, since the electroless nickel plating of oxidation-reduction type is applied on the aluminum electrodes of the semiconductor device inside of nickel plating solution, which is added with sodium hydroxide solution having a function of dissolving aluminum oxide, dissolved with a reducing agent (e.g. sodium hypophosphite).

An application of the above process facilitates an initial deposit of nickel, and a plating process such as electroless gold plating can be carried out easily over the nickel film, when the semiconductor device having aluminum electrodes is immersed in the plating solution.

Electroless Ni—P plating solution and electroless Ni—B plating solution are some of the examples that can be used for the above electroless plating solution.

Alkaline plating solution or acid plating solution having sodium hypophosphite as a reducing agent can also be used for the electroless nickel plating solution. It has been known in the present invention that it is important for the plating solution to be adjusted to pH of 4.0 to 6.8 as for the acid plating solution in order to form a nickel plate film uniformly over the every aluminum electrode, and the plating can be efficiently carried out in the present invention, since alkaline solution including a reducing agent to be added to the plating solution is adjusted of its pH at 9.0 to 12.0 so as not to cause the plating solution to exceed pH of 7, whereas the plating solution becomes whitely turbid due to deposits of nickel hydroxide if the plating solution exceeds pH of 7.

Although the pH decreases as nickel ion is consumed along a progress of the plating process, adhesion of the plating can be maintained well by suppressing the decrease of pH to a certain extent with addition of alkaline solution. If the alkaline solution including the reducing agent exceeds pH of 12.0, an adverse effect such as deterioration of the passivation film on the semiconductor device can result. When thick plating is intended, a bump having steady shape can be formed by swaying the semiconductor device sufficiently within the plating solution.

Moreover, when carrying out an electroless nickel plating process, the nickel plate can be made as a body of the bump or is formed to be a part of the bump, depending the mounting configuration, by increasing a thickness (10 to 15 $\mu$m) of the deposited nickel plate.

In other words, a solder bump may be formed by applying 2 to 5 $\mu$m of electroless nickel plating on the aluminum electrode of the semiconductor device, then applying approximately 0.05 $\mu$m of substitutional electroless gold plating on top of it, and further with a wire bonding method, by using a solder wire, for instance, if it is solder-bonded with a lead wire of the electrode on the circuit substrate.

If, on the other hands, it is bonded to a Sn-plated lead wire of the electrode on the circuit substrate in a way to form Au—Sn eutectic alloy such as with a TAB mounting, a bump may be formed by applying 10 to 15 $\mu$m of nickel plating on the aluminum electrode of the semiconductor device, then applying approximately 0.05 $\mu$m of substitutional electroless gold plating on its surface, and further forming approximately 2 $\mu$m of electroless gold plate film of oxidation-reduction type.

Also, if a lead wire of the electrode on the circuit substrate is bonded to a bump by using a unisotropic conductive rubber or a conductive adhesive, the aluminum electrode of the semiconductor device may be applied with 10 to 15 $\mu$m of nickel plating, and on top of its surface with approximately 0.05 $\mu$m of substitutional electroless gold plating so as to use them as the bump.

Exemplary embodiments of the present invention are now described hereinafter by referring to FIG. 1 through FIG. 9.

First Exemplary Embodiment

First, a passivation film 13 composed of $Si_3N_4$ is formed on an entire surface of a silicon substrate 11 having various kinds of transistors, wiring, etc constructed thereon by a conventional method, after electrode 12 of aluminum (Al—1% Si) is formed on the same, as shown in FIG. 1A. A semiconductor device with most of the aluminum electrode 12 exposed by selectively removing the passivation film 13 by etching is prepared next.

Figure 1B:
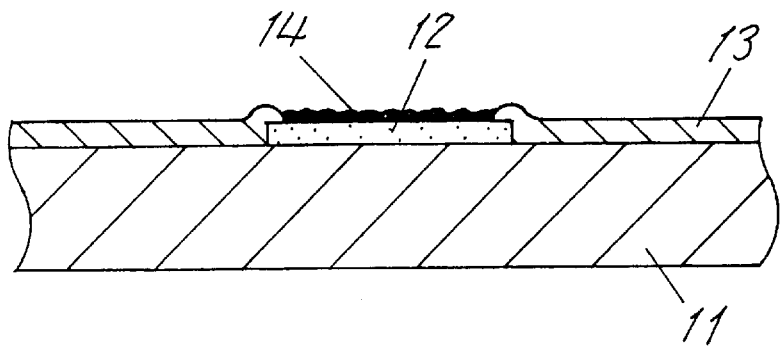

A surface of the aluminum electrode 12 of the semiconductor device was cleaned with de-ionized water after execution of light etching by acid liquid containing fluoride compound, as shown in FIG. 1B. It was then subjected to a desmut process with smut removing liquid. Consecutively, the semiconductor device was washed with de-ionized water after zinc deposit 14 was deposited on the surface of the aluminum electrode 12, the surface of which was exposed with substitutional reaction, by immersion the semiconductor device for 20 seconds in zincate treatment liquid, whose main component is sodium hydroxide solution containing Fe as a metallic additive and dissolved with zinc oxide.

Then, it was subjected a dissolving process of deposited zinc by immersing it for 30 seconds in 50% solution of nitric acid, followed by washing with water, followed by a second zincate treatment and dissolving process, and again washed with de-ionized water after a third zincate treatment.

Figure 1C:
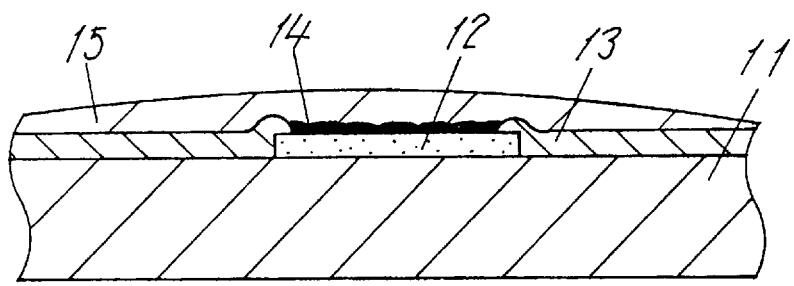

Successively, as shown in FIG. 1C it was immersed for 10 seconds in solution 15, which was prepared by dissolving 25 gr of sodium hypophosphite as a reducing agent into 750 ml of water, followed by addition of de-ionized water while adjusting the pH between 9.0 to 12.0 with sodium hydroxide solution, so as to make a total volume of 1000 ml. The semiconductor device was then immersed in de-ionized water immediately thereafter, and 4 to 5 $\mu$m of a nickel film 16 containing phosphor was formed on the aluminum electrode 12 by immersing it for about 10 minutes in electroless nickel plating solution of oxidation-reduction reacting type, which consists of compositions described below with a further addition of sulfur compound (e.g. thiodiglycolic acid, etc.) as a reaction promoter for a several ppm, and adjusted the pH between 4.0 to 6.8 and a temperature between 80 to 90° C.

A nickel plate film having no practical problem in surface roughness of 1 $\mu$m or less and a shear strength of 20 gr-f/(25 $\mu$m×45 $\mu$m) or greater could be obtained even with only one zincate treatment in case of the aluminum electrode containing Cu, for example, Al—1% Si—2% Cu, although a plate film having fine surface configuration and physical superiority could be obtained by repeating the zincate treatment 3 times if the aluminum electrode was composed of Al—1% Si.

An adhesion force is also increased by adding Fe to the zincate treatment liquid.

Furthermore, it was noted that particulate deposit (zinc-iron system alloy film) on the surface tends to become finer with an addition of Fe.

Also, a superior film configuration was attained by adding a several ppm sulfur compound (e.g. thiodiglycolic acid) as a reaction promoter in the nickel plating solution of oxidation-reduction reacting type. It was also found that the reaction promoter of sulfur compound, depending on the amount added, produces a great effect to the film configuration of plating.

Figure 1D:
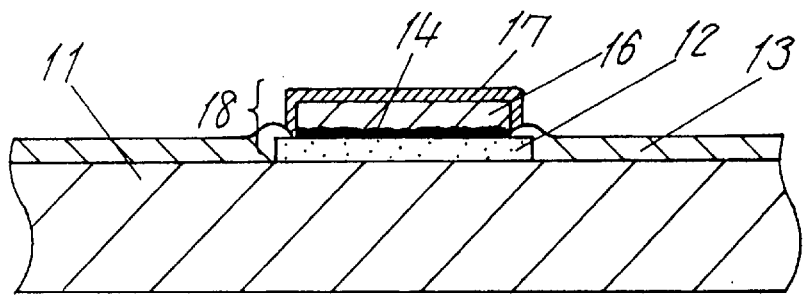

In addition, a flash gold plate film 17 in the thickness of 0.05 $\mu$m was formed on a surface of the nickel film 16 by immersing the semiconductor device for approximately 10 minutes in electroless gold plating solution of substitutional reaction type (e.g., "OPC Muden-gold" manufactured by Okuno Pharmaceutical Industries, Inc., pH at 5.8, liquid temperature of 90° C.) after cleaning it with de-ionized water, as shown in FIG. 1D.

A composition of the electroless nickel-plating solution of oxidation-reduction reacting type used for the present embodiment is noted below.

(A composition of the electroless nickel plating solution of oxidation-reduction reacting type)

| | | |
|---|---|---|
| Nickel sulfate | 7.4 | gr/l |
| Sodium hypophosphite | 12 | gr/l |
| Rochell salt | 13 | gr/l |
| Malic acid | 10 | gr/l |
| Sodium acetate | 6 | gr/l |
| Thioglycolic acid | 300 | mgr/l | pH adjusted to 4.0 to 6.8 by adding sodium hydroxide solution.

Figure 2:
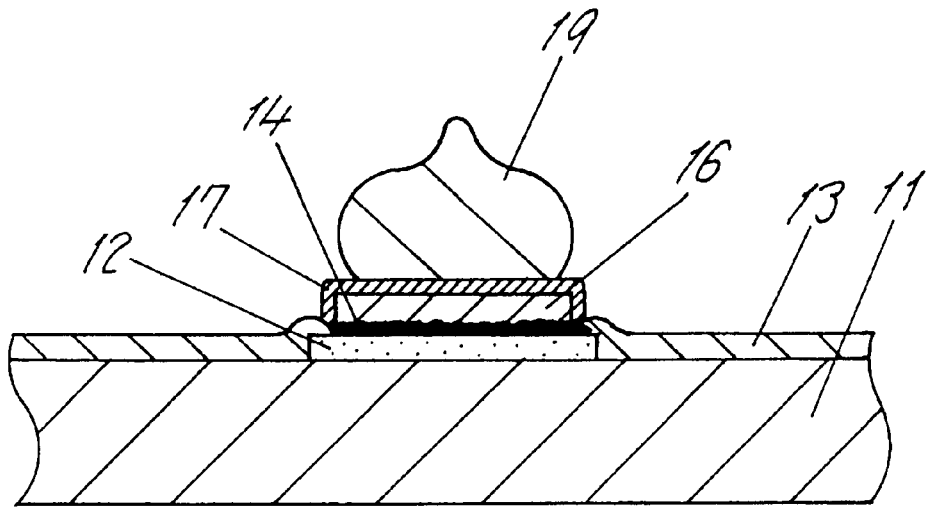
FIG. 2 is a fragmentary cross sectional view of the semiconductor device, which is wire-bonded with a solder wire on a plating film composed of nickel film formation and electroless gold plating of the first exemplary embodiment of the present invention.

A plating film 18 of Ni (4 to 5 μm)—Au(0.05 μm) was formed on the entire surface of the aluminum electrode 12 of the semiconductor device by the above plating process. The plating film 18 was adhered very strongly to the aluminum electrode 12. Also, a good bonding was achieved by forming a solder bump 19 by means of wire-bonding using a solder wire, and mounting the semiconductor device with a face down method to an Ag—Pd electrode wired on a ceramic substrate, as shown in FIG. 2.

Figure 3:
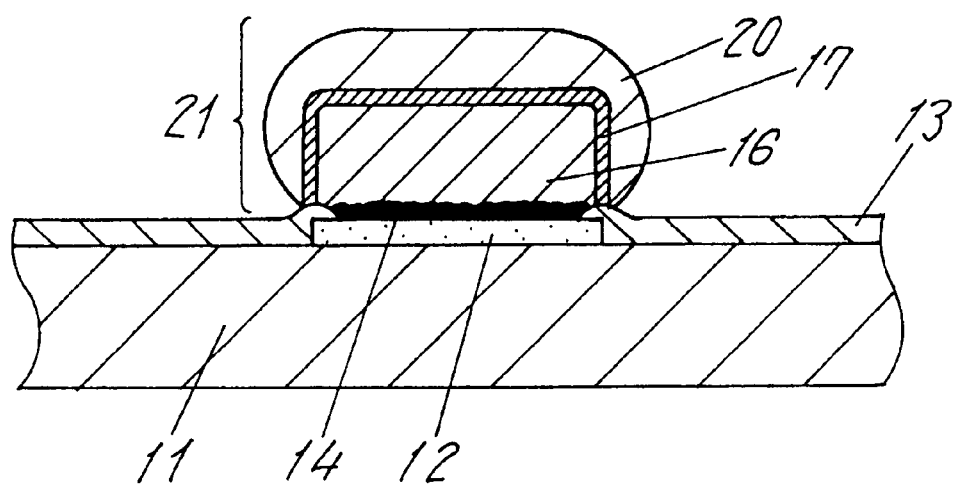
FIG. 3 is a fragmentary cross sectional view of the semiconductor device, which is formed with a bump for TAB mounting by applying a gold plate of oxidation-reduction reacting type after formation of a nickel film and an electroless gold plate of substitutional reaction type of the first exemplary embodiment of the present invention.

The example described above used a plating film of Ni: 4 to 5 μm and Au: 0.05 μm. In the present embodiment, it is also possible to create a bond by forming an Au—Sn eutectic alloy with an inner lead of a TAB tape carrier plated with Sn, by way of forming a nickel film 16 (12 to 14 μm) with the electroless nickel plating in the same manner as the present embodiment for 30 minutes, and an electroless gold plate film 17 (0.05 μm) of substitutional reaction type, followed by forming a gold plate film 20 having a thickness of approximately 2 μm by immersing it for 120 minutes in electroless gold plating solution of oxidation-reduction reacting type consisting of the following compositions at pH 7.0 and a temperature of 60° C., so as to make a bump 21 having a height of approximately 15 μm, as shown in FIG. 3.

(A composition of the electroless gold plating solution of oxidation-reduction reacting method)

| | | |
|---|---|---|
| Sodium chloroaurate | 10 | gr/l |
| Sodium sulfite | 25 | gr/l |
| Sodium thiosulfate | 50 | gr/l |
| Sodium ascorbate | 80 | gr/l |
| Ammonium chloride | 5 | gr/l |

A second exemplary embodiment of the present invention is described next by referring to FIG. 4A through FIG. 7B.

Figure 4A:
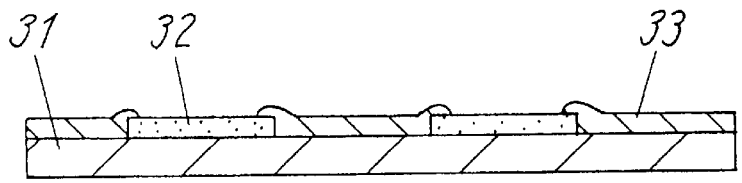
FIG. 4A through FIG. 4F are fragmentary cross sectional views of a semiconductor device showing individual processes of a second exemplary embodiment of the present invention.

A semiconductor device (FIG. 4A) was prepared by forming an aluminum electrode 32 by means of the conventional method on a silicon substrate 31 constructed thereon with various transistors, wiring, etc., followed by forming a passivation film 33 composed of $Si_3N_4$ on an entire surface of it, followed further by selectively removing the passivation film 33 with etching, so as to expose most part of the aluminum electrode 32, as shown in FIG. 4A. FIG. 6 depicts an arrangement plan of pads of the semiconductor device, and Table 1 shows coordinates of the same pads.

TABLE 1

| No. | Pin Name | X | Y | No. | Pin Name | X | Y |
|---|---|---|---|---|---|---|---|
| 1 | GND | 2594 | 439 | 13 | POC0 | −2564 | −293 |
| 2 | XIN | 2510 | 1073 | 14 | POC1 | −2564 | −726 |
| 3 | XOUT | 2510 | 1273 | 15 | POC2 | −2564 | −1209 |
| 4 | RESETN | 1900 | 1306 | 16 | POC3 | −2199 | −1324 |
| 5 | POA0 | 1081 | 1324 | 17 | INT | −1628 | −1329 |
| 6 | POA1 | 598 | 1324 | 18 | POD0 | −567 | −1287 |
| 7 | POA2 | −1258 | 1324 | 19 | POD1 | 1195 | −1287 |
| 8 | POA3 | −1741 | 1324 | 20 | POD2 | 1729 | −1287 |
| 9 | POB0 | −2174 | 1324 | 21 | POD3 | 2263 | −1287 |
| 10 | POB1 | −2564 | 1209 | 22 | POE0 | 2527 | −1287 |
| 11 | POB2 | −2564 | 726 | 23 | POE1 | 2527 | −753 |
| 12 | POB3 | −2564 | 293 | 24 | VDD | 2523 | −219 |

Figure 4B:
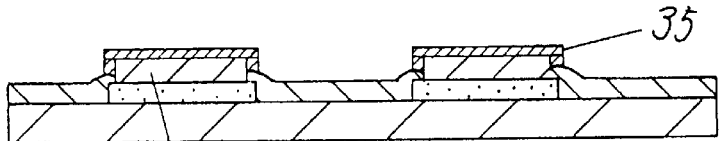

Next, in a metallizing process, zinc particles are deposited by immersing the semiconductor device in zincate treatment liquid after removal of oxidized layer of Al with light-etching on a surface of the aluminum electrode 32 of the semiconductor device, as shown in FIG. 4B. A nickel film 34 was formed on the aluminum electrode 32 by immersing it in electroless nickel plating solution of an oxidation-reduction reacting type. Then, a barrier metal layer composed of Ni—Au was formed on a surface of the nickel film 34 by composing a flash gold-plate film 35 in a thickness of 0.05 μm by immersing it in electroless gold plating solution of a substitutional reacting type.

Figure 4C:
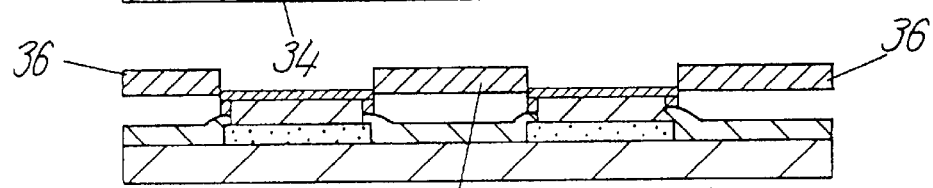
Figure 4D:
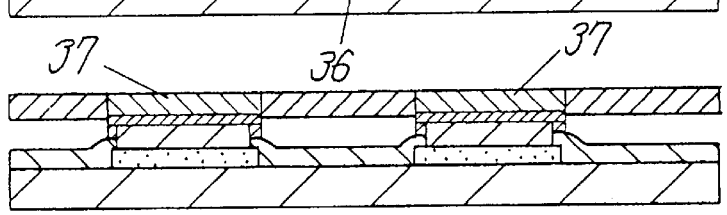

Next, a metal mask 36, which is utilized as a mask for an ordinary screen printing, is prepared for a process of masking and filling of cream solder as shown in FIG. 4C and FIG. 4D. An opening shape of the metal mask 36 was so formed as to be larger than an area of the electrode surface of the semiconductor device, and in a long and narrow shape (FIG. 7). The metal mask 36 was set so as to align the opening with the electrode of the semiconductor device, the opening of the metal mask 36 was filled by a squeegee with cream solder 37, of which solder particles are of 5 to 20 μm in diameter, and the cream solder was printed on the surface of the semiconductor device including the electrode of the semiconductor device by lifting the metal mask 36.

Figure 4E:
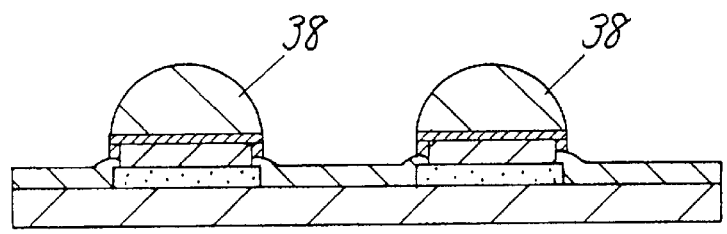

A bump 38 having a good solder adhesion can be formed on the barrier metal layer by passing it through a solder reflow furnace in a heating process, as shown in FIG. 4E.

Figure 5:
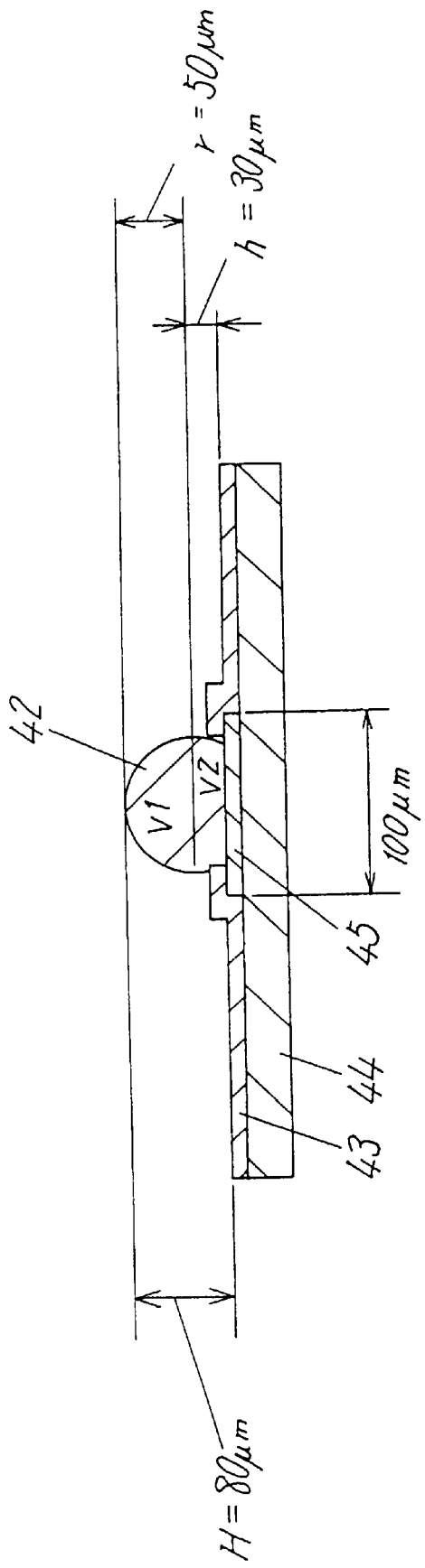
FIG. 5 is a cross sectional view of a bump shape in the second exemplary embodiment of the present invention.

An opening shape of the mask is described hereinafter. A height of the solder bump correlates with an amount of the printed cream solder. First, a volume of the solder bump was obtained with the following formula on the supposition of a shape of the solder bump, as shown in FIG. 5.

$$V = V1 + V2 = (4/3\ \pi r^3 \times 1/2) + xyh$$
where, V: a volume of solder bump
  V1: a volume of an upper half of the solder bump
    (a half of sphere: $4/3\ \pi r^3 \times 1/2$)
  V2: a volume of a lower part below the upper half of the solder bump (an opening area of Al electrode (x y) × height (h) )

A volume of the cream solder becomes approximately one half after melting, because a flux component, which is washed away after dissolving, shares approx. 50% volume of the cream solder used in the present embodiment.

Therefor, the opening of the mask was designed to have a volume of 2V, as it is desirable to have the cream solder in an amount of 2V in order to obtain a required solder bump.

In the present embodiment, a volume of the solder bump was given as V=561,799 μm³, with r=50 μm, h=30 μm, and opening dimensions x and y for the Al electrode as x=100 µm, y=100 µm, in order to produce the solder bump 42 to have a height (H) of 80 µm, as shown in FIG. 5.

An optimum thickness of the metal mask lies between 25 to 75 µm for the purpose of producing the metal mask and also in a viewpoint of transferability of the cream solder from the metal mask. If the thickness of the metal mask becomes equal to or greater than 75 µm, the transferability is impaired, resulting in a large dispersion of height of the solder bump. Also, if it becomes 25 µm or less, a satisfactory bump can not be formed as it tends to get a flaw, a crack, a wrinkle, etc.

An opening area (S) of the metal mask of the present embodiment was S=2V/50=22,472 µm², since a metal mask used was 50 µm in thickness.

It is desirable to choose a length and a breadth dimensions in due consideration of a space between the adjoining electrodes when determining the opening area (S) of the metal mask. For the semiconductor device of the present embodiment, an elongated shape of 110 µm by 204 µm was used for electrode size of 100 µm by 100 µm of the semiconductor device as shown in FIG. 7, since there is a portion where a space is 200 µm between the electrodes (an arrangement plan of pads in FIG. 6 and coordinates of pads in Table 1: a space between No. 2 and No. 3).

In case of a semiconductor device having a narrow space between electrodes, it is necessary to adjust volume of an opening in order to keep a height of the solder bump to be nearly uniform by forming the opening shape of the mask to be long and narrow. However, since it has a tendency of creating a short-circuiting due to a diffusion as the space gets narrower between electrodes, it is desirable to form at least 50 µm of a space from one end of an electrode to the next end of another electrode, although it depends on size of the electrodes.

A metal mask having an elongated shape as shown in FIG. 7 was used for the electrode arrangement shown in FIG. 6 of the semiconductor device in the present embodiment.

Although solder paste having solder particles of 5 to 20 µm diameter was used, a dispersion in height of a solder bump would become very large if diameter of the solder particles exceeds 20 µm, because a size of the electrode opening of the semiconductor device is normally as small as 60 to 150 µm. On the other hand, if the diameter of the solder particles is less than 5 µm, it tends to create voids in the solder bump because the solder particles in the paste are liable to be oxidized, so as to cause a problem in reliability.

Since the diameter of the solder particles was 5 to 20 µm in the solder paste of the present embodiment, it could suppress dispersion within ±7 µm against the bump height of 80 µm in a 6-inch wafer.

Figure 4F:
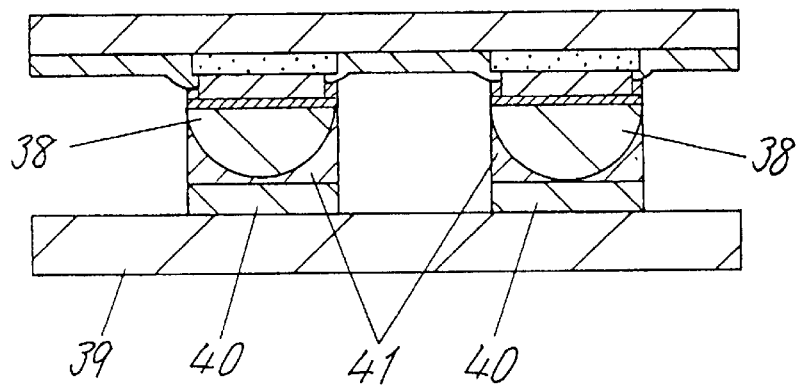

A semiconductor module is obtainable by carrying out an ordinary flip-chip bonding as shown in FIG. 4F with the semiconductor device formed with this solder bump. That is, a semiconductor chip formed with the solder bump 38 is bonded on a circuit substrate 39, of which electrode 40 is printed with eutectic solder paste 41, after the semiconductor device wafer formed with the solder bump 38 is diced into individual semiconductor chips, and it is placed in a reflow furnace. A semiconductor module (FIG. 4F) was produced by sealing it thereafter with polymeric resin of epoxy group (not shown in the figures) as an under-filling material. With regard to the barrier metal for producing the solder bump, a metallized layer, which is formed by means of a conventional vapor-deposition method or a sputtering method, for being connectable with solder, may be used beside what has been described in the present embodiment.

Also, the same result as the metal mask could be obtained, when a bump was made similarly by making a resin mask (of polyimide, PET, etc.) as a substitute for the metal mask.

As has been described, the present embodiment is able to suppress a stress that occurs when a metallized layer is formed on an entire surface of the wafer as in the past by vapor-deposition, etc., since the passivation film and the electrode are not corroded with use of an extremely simple facility and a simple method, and only the electrode is metallized with the metallizing process of the electroless plating.

Also, a required height of the solder bump can be obtained by controlling an amount of the cream solder with the mask. Moreover, an accuracy of filling into the mask was improved by using the solder of small particle diameter (5 to 20 µm), and an accuracy of the bump height could be improved remarkably as the result.

Furthermore, a technique of the present invention is also applicable in case of a narrow space between the electrodes, by adapting a shape of the mask (forming an opening of the mask in a long and narrow shape) or a structure of the mask (composing the mask in two layers) in response to a trend of reduction in the electrode space of the semiconductor device.

Third Exemplary Embodiment

A third exemplary embodiment of the present invention is described next by referring to FIG. 8A through FIG. 8E and FIG. 9A through FIG. 9F.

First, an aluminum electrode 47 was formed by means of the conventional method on a silicon substrate 49 constructed thereon with various transistors, wiring, etc., followed by forming a passivation film 46 composed of $Si_3N_4$ on an entire surface of it. Then a semiconductor device is prepared by selectively removing the passivation film 46 by etching, so as to expose most of the aluminum electrode 47.

Figure 8A:
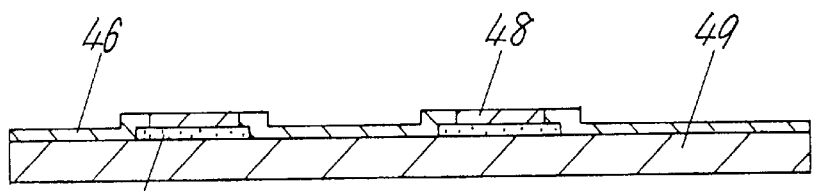
FIG. 8A through FIG. 8E are fragmentary cross sectional views of a semiconductor device showing individual processes of a third exemplary embodiment of the present invention.
Figure 8B:
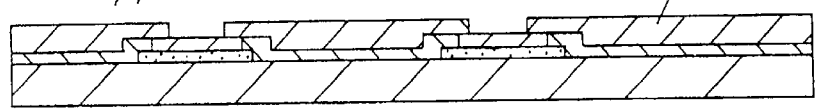

Next, in a metallizing process, zinc particles were deposited by immersing the semiconductor device in zincate treatment liquid after removal of oxidized layer of Al with light-etching on a surface of the aluminum electrode 47 of the semiconductor device, and a nickel film was formed on the aluminum electrode 47 by immersing it in electroless nickel plating solution of an oxidation-reduction reacting type as shown in FIG. 8A. Then, a barrier metal 48 composed of Ni—Au was formed by composing a flash gold plate film in a thickness of 0.05 µm over a surface of the nickel film by immersing it in electroless gold plating solution of a substitutional reacting type.

Next, a surface of the semiconductor wafer formed with the barrier metal 48 was uniformly coated with photosensitive polyimide named "Photo-neece" (manufactured by Toray Industries, Inc.) by a spinner, followed by pre-baking (70° C.×1 min., 90° C.×1 min. and 105° C.×2 min.). After the above, a first layer of a pattern (in a shape that determines size of a bottom part of a bump on the electrode of semiconductor device) for composing an opening in a size equal to or smaller than a surface area of the electrode of the semiconductor device, is exposed and developed after a pre-develop baking (80° C.×1 min.). It is then cured (140° C.×3 min. and 350° C.×60 min.) to form a first polyimide layer 50 (10 µm after curing, FIG. 8B).

Next, the photosensitive polyimide of "Photo-neece" (manufactured by Toray Industries, Inc.) was again coated uniformly by a spinner on the semiconductor wafer formed with the first polyimide layer 50, and pre-baked (60° C.×3 min., 80° C.×3 min. and 100° C.×6 min.). After that, a second layer of a pattern (provided with a larger opening than the opening of the first layer) is exposed and developed after a pre-develop baking (60° C.×1 min.). It is then cured (140° C.×3 min. and 350° C.×60 min.) to form a second polyimide layer 51 (20 μm after curing, FIG. 8C).

Figure 8C:
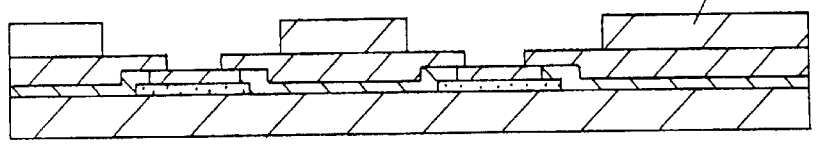
Figure 8D:
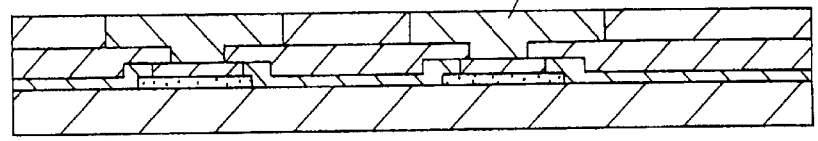

Then, the openings of the first and the second polyimide layers were filled with cream solder 52, of which solder particles are of 5 to 20 μm in diameter, by a squeegee on the second polyimide layer 51 (FIG. 8D).

Figure 8E:
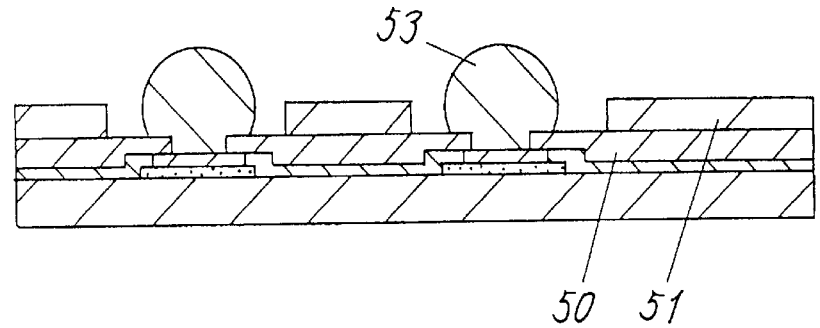
Figure 10A:
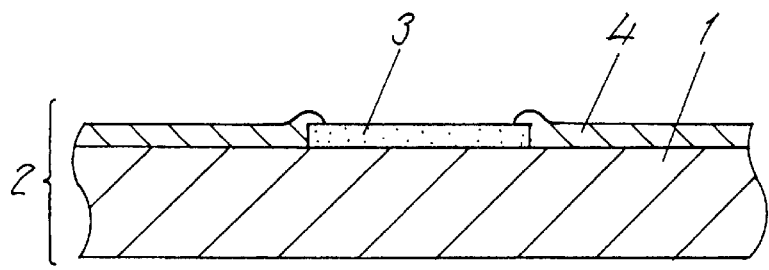
FIG. 10A through FIG. 10C are fragmentary cross sectional views of a semiconductor device showing individual treatment processes of plating on an aluminum electrode of the prior art.
Figure 10B:
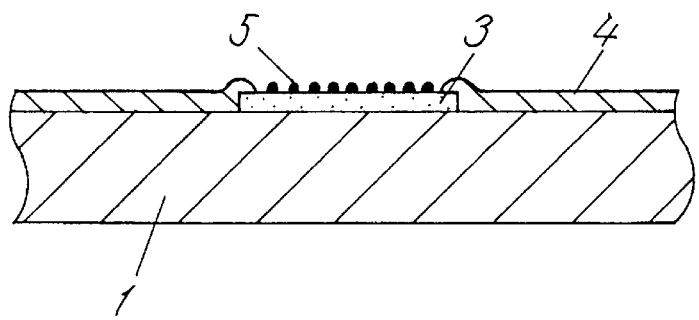
Figure 10C:
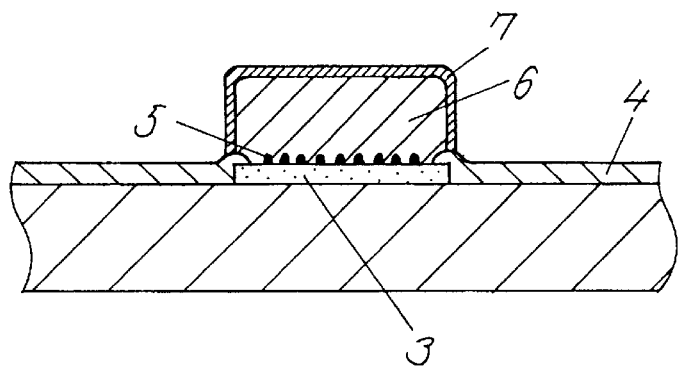

Following the above, a solder bump 53 is formed on the barrier metal layer 48 by passing it through a solder reflow furnace to melt the solder particles in the cream solder (FIG. 8E).

The mask is not removed in the above process, but it is left on the semiconductor device as a protective film.

Because the present invention utilizes polyimide for the masking material, it can suppress α-rays, which impair a semiconductor memory, etc. by leaving the mask on the semiconductor device as a protective film so as to prevent malfunctions of the memory.

Also, the mask was composed of two layers in order to form a solder bump of a large height, and respective shapes of the openings in the first and the second layers were differentiated. An opening size of the first layer determines a size of the bump, and it relates to a height of an opening size of the second layer.

The opening shapes of the first mask layer and the second mask layer are described now. A volume of the opening is based on the same principle as the first exemplary embodiment, and a summed volume of the openings of the first layer and the second layer determines a height of bump. First, a volume of the solder bump was obtained with the following formula on the supposition of a shape of the solder bump, as shown in FIG. 5.

$$V = V1 + V2 = (4/3\, \pi r^3 \times 1/2) + xyh$$

where, V: a volume of solder bump
    V1: a volume of an upper half of the solder bump
    (a half of sphere: $4/3\, \pi r^3 \times 1/2$)
    V2: a volume of a lower part below the upper half of the solder bump (an opening area of A1 electrode (x y) × height (h))

A volume of the cream solder becomes approximately one half after melting, because a flux component, which is washed away after cleaned, shares approx. 50% volume of the cream solder used in the present embodiment.

Therefor, the mask opening was designed to have a volume of 2V, as it requires the cream solder in an amount of 2V in order to obtain a required solder bump.

In the present embodiment, a volume of the solder bump (V=561,799 μm$^3$) was calculated with r=50 μm, h=30 μm, and opening dimensions x and y for the Al electrode as x=100 μm, y=100 μm, in order to create the solder bump in a height (H) of 80 μm, as shown in FIG. 5.

The first layer of polyimide and the second layer of polyimide were formed in the thicknesses of 10 μm and 20 μm respectively in the present embodiment.

They were therefore designed to be: (opening area of 1st layer)×(10 μm)+(opening area of 2nd layer)×(20 μm)=2V. An opening size of the first layer determines a shape of a bottom surface of the solder bump, in regard to an electrode arrangement of the semiconductor device (FIG. 6). An opening size of 90 μm×90 μm was chosen in the present embodiment (FIG. 9A and FIG. 9B). An opening of the second layer relates to a height of the solder bump. A solder bump in the height of 80 μm is given by: (opening area of 2nd layer (S))={2V—(opening area of 1st layer)×(10 μm)}/20 μm=52,130 μm$^2$.

Since there are portions in the semiconductor device of the present embodiment, where spaces between the electrodes are 264 μm (the arrangement plan of pads in FIG. 9 and coordinates of pads in Table 1: a space between No. 21 and No. 22) and 200 μm (the arrangement plan of pads in FIG. 9 and the coordinates of pads in Table 1: a space between No. 2 and No. 3), an elongated shape of 110 μm by 473 μm (FIG. 9C and FIG. 9E) was adopted for those portions, and an elongated shape of 200 μm by 260 μm (FIG. 9C and FIG. 9D) was adopted for the other portions.

The present embodiment is also able to form a desirable solder bump on the barrier metal layer by passing through a solder reflow furnace in the same manner as in the second exemplary embodiment. In case of a semiconductor device having a narrow space between the electrodes, a volume of the opening was adjusted by forming the opening shape of the second mask layer to be long and narrow in order to keep a height of the solder bump approximately uniform. FIG. 8C and FIG. 9F depict the first and the second layers piled one over another.

If polyimide is used for the mask, it is necessary to form at least 20 μm of a space from one end of an electrode to the next end of another electrode, although it depends on size of the electrodes, because there is a tendency of creating a short-circuiting due to a diffusion as the space gets narrower between the electrodes, Accordingly, the third exemplary embodiment, as described above, was able to keep dispersion in the height of the solder bump within ±5 μm by controlling the bump height at 80 μm within a 6-inch wafer.

A high reliability was attained with a semiconductor module produced by carrying out an ordinary flip-chip bonding of the semiconductor device formed with this solder bump, together with polymeric resin of epoxy group used as an under-filling material.

As has been described, the present invention is able to steadily form a nickel film on an aluminum electrode, including certain distinctive pads of the semiconductor device such as GND, Vcc, etc. which had been difficult to plate with the prior technique, with a considerably simple operation at a low cost. Using the nickel film formation of the present invention as a basis, salient electrodes, having a high reliability and no likeliness of short-circuiting between the electrodes, are producible at a high rate of yield by utilizing techniques of gold plating process, solder-wire bonding, etc., over the nickel film, so that it has a great industrial value in realizing numerous methods of face-down mounting, etc.

The present invention is also capable of improving the reliability and a rate of yield, because it makes production of a barrier metal by way of a vapor-deposition method, a sputtering method, etc.

It may thus be possible to form a bump at a substantially lower cost, as compared to a bump formed by the expensive vapor-deposition method.

Accordingly, a bump and a module of high reliability and low cost can be realized with the method of forming a solder bump and a method of producing a semiconductor module in accordance with the exemplary embodiments of the present invention.

What is claimed is:

1. A method of forming an electrode of a semiconductor device comprising:
   a) Treating a surface of an aluminum electrode of the semiconductor device with acid solution or alkaline solution to obtain a light-etched surface;
   b) treating the light-etched surface of said aluminum electrode with alkaline zincate solution;
   c) activating the zincate-treated surface of said aluminum electrode by immersing said aluminum electrode treated by said alkaline zincate solution into alkaline solution dissolved with a reducing agent; and
   d) nickel-plating said aluminum electrode by immersing said electrode into electroless nickel plating solution of oxidation-reduction reacting type, while the surface of said aluminum electrode is in an activated condition.

2. The method of forming an electrode of a semiconductor device according to claim 1, wherein said alkaline solution dissolved with a reducing agent comprises sodium hypophosphite and sodium hydroxide with a pH between approximately 9.0 to 12.0.

3. The method of forming an electrode of a semiconductor device according to claim 1, wherein step b) is carried out a plural number of times.

4. The method of forming an electrode of a semiconductor device according to claim 1, wherein said alkaline zincate solution comprises zinc oxide and sodium hydroxide, and further includes Fe as a metallic additive.

5. The method of forming an electrode of a semiconductor device according to claim 1, wherein, a reaction-promoting agent composed of sulfur compound is added to said electroless nickel plating solution.

6. The method of forming an electrode of a semiconductor device according to claim 5, wherein, said sulfur compound is thiodiglycolic acid.

7. The method of forming an electrode of a semiconductor device according to claim 1, further comprising the steps of:
   flash gold plating said aluminum electrode in electroless gold plating solution of substitutional reaction type; and
   gold plating a film to said aluminum electrode by immersing said aluminum electrode in electroless gold plating solution of oxidation-reduction reacting type comprising sodium ascorbate or salt thereof, and gold sulfite or salt thereof or chloroauric acid or salt thereof.

8. A method of forming a solder bump comprising:
   metallizing a surface of an aluminum electrode;
   covering the metallized surface of said aluminum electrode with a mask having an opening of an area greater than the surface of said electrode;
   filling said opening with cream solder; and
   heating said cream solder after removal of said mask,
   wherein said cream solder coagulates on the surface of said electrode by the heating, and forms a solder bump having a height higher than a thickness of said mask.

9. The method of forming a solder bump according to claim 1, wherein a volume of the opening is adjusted so as to cause a height of the solder bump to be uniform.

10. The method of forming a solder bump according to claim 1, wherein a shape of the opening is adjusted according to a size of the electrode surface, and a volume of the opening is adjusted so as to cause a height of the solder bump to be approximately uniform, in case of the electrode having a different surface size.

11. The method of forming a solder bump according to claim 1, wherein a diameter of solder particle of the cream solder is approximately between 5 to 20 µm.

12. The method of forming a solder bump according to claim 1, wherein the mask comprises a metal mask or a polymeric resin mask.

13. The method of forming a solder bump according to claim 1, wherein the mask comprises two layers, and further wherein an opening of a first layer is formed in a size equal to or smaller than the electrode surface, and an opening of a second layer is formed in a size greater than an opening area of the first layer.

14. The method of forming a solder bump according to claim 6, wherein an area of the bump is adjustable by altering an opening size of the first layer, and a height of the bump is adjustable by way of altering an opening size of the second layer.

15. The method of forming a solder bump according to claim 6, wherein the first layer and the second layer are composed of photosensitive polyimide.

16. A method of producing a semiconductor device module comprising:
   treating a surface of an aluminum electrode of the semiconductor device with acid solution or alkaline solution so that the surface of said aluminum electrode is light etched;
   treating the light-etched surface of said aluminum electrode with alkaline zincate solution so that the surface of said aluminum electrode is zincate-treated;
   activating the zincate-treated surface of said aluminum electrode by immersing said aluminum electrode treated by said zincate treatment into alkaline solution dissolved with a reducing agent;
   nickel-plating said aluminum electrode by immersing it into electroless nickel plating solution of oxidation-reduction reacting type, while the surface of said aluminum electrode is in an activated condition;
   forming a solder bump on said electroless nickel-plated aluminum electrode;
   connecting an electrode pad of a wiring substrate for mounting said semiconductor device and said solder bump of said semiconductor device by way of heating after the two are placed one upon another; and
   pouring under-filling material between said semiconductor device and said wiring substrate.

* * * * *